United States Patent [19]
Strickland et al.

[11] Patent Number: 5,376,187
[45] Date of Patent: Dec. 27, 1994

[54] DIFFUSION BONDING OF ALUMINUM AND ALUMINUM ALLOYS

[75] Inventors: George Strickland; Ian Bottomley, both of Preston; Christopher Somerton; Steven Harris, both of Bristol, all of Great Britain

[73] Assignee: British Aerospace Public Limited Company, Farnborough, Great Britain

[21] Appl. No.: 45,853

[22] Filed: Apr. 9, 1993

[30] Foreign Application Priority Data

Feb. 12, 1993 [GB] United Kingdom ............... 9208223

[51] Int. Cl.⁵ .......................... C21D 1/06; B23K 35/22
[52] U.S. Cl. ..................................... 148/212; 228/193
[58] Field of Search ............... 148/212, 220, 238, 317; 228/263.12

[56] References Cited

U.S. PATENT DOCUMENTS

| | | |
|---|---|---|
| 4,522,660 | 6/1985 | Suzuki et al. . |
| 4,597,808 | 7/1986 | Tachikawa et al. . |
| 4,698,233 | 10/1987 | Ohira et al. . |
| 5,222,653 | 6/1993 | Joyce et al. . |
| 5,224,645 | 7/1993 | Cooper et al. . |

FOREIGN PATENT DOCUMENTS

| | | |
|---|---|---|
| 091371 | 10/1983 | European Pat. Off. . |
| 0158271 | 10/1985 | European Pat. Off. . |
| 0346931 | 12/1989 | European Pat. Off. . |
| 0350220 | 1/1990 | European Pat. Off. . |
| 0398760 | 11/1990 | European Pat. Off. . |
| 1024765 | 4/1966 | United Kingdom . |
| 2167329 | 5/1986 | United Kingdom . |

*Primary Examiner*—Deborah Yee
*Attorney, Agent, or Firm*—Cushman, Darby & Cushman

[57] ABSTRACT

The diffusion bonding of aluminum and aluminum alloys presents problems because, when left exposed to the atmosphere even for a short time, they acquire an extremely tenacious surface oxide layer that inhibits or prevents satisfactory diffusion bonding. Unlike titanium, this oxide layer is not absorbed at diffusion bonding temperatures. The present invention comprises a method of reducing oxidation of a surface of aluminum or aluminum alloy by causing a nitride film to form on the surface. This film is believed to prevent oxidation of the aluminum or aluminum alloy, but to be absorbable into it at diffusion bonding temperatures. In the preferred embodiment shown in FIG. 1, the nitride film is applied to the piece of aluminum or aluminum alloy (10) in a vacuum chamber (4) by sputtering with nitrogen ions, or by heating the piece (10) in a nitrogen gas atmosphere.

2 Claims, 1 Drawing Sheet

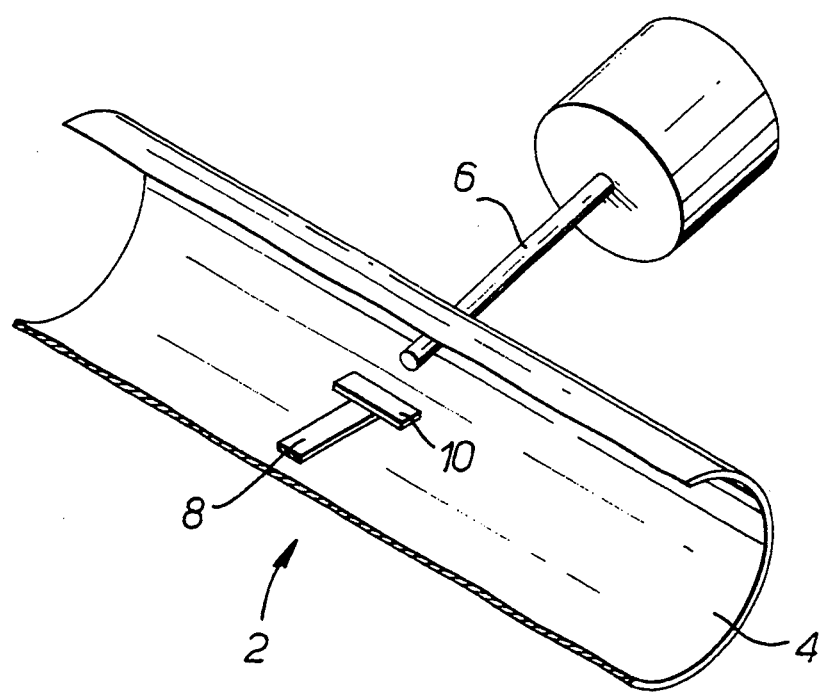

DIFFUSION BONDING OF ALUMINUM AND ALUMINUM ALLOYS

BACKGROUND

This invention relates to the reduction of oxidation of aluminium and aluminium alloys.

Diffusion bonding is an extremely useful technique for joining metal components, particularly in the aircraft industry, and involves the pressing together of the components when heated so that their atoms interdiffuse at the interface, thus forming a metal-to-metal bond between the components. Diffusion bonding can be combined with the process of superplastic forming if certain types of metal are used that have a specific uniform grain structure (for example titanium or aluminium) thus enabling the manufacture of multi-sheet components of complex structure. Superplastic forming is a technique in which a heated metal is subjected to slow deformation during which the metal stretches (up to several hundred percent) without fracture or significant necking. In order to manufacture these components it is often a requirement that the metals are not bonded at all in their contacting areas. Therefore, bond inhibitors (commonly known as stop-off or stopping-off materials) are applied to selected areas by, for example, a silk screen printing process.

Titanium is a particularly suitable material for use in such processes because it will absorb its own oxide layer at high temperature in an inert atmosphere to provide an oxide-free surface necessary for satisfactory diffusion bonding.

However, the physical properties of aluminium and many of its alloys, i.e. low density and high strength, make it an ideal material for use in aircraft components and the like. Such materials, if left exposed to the atmosphere for even a short time, acquire an extremely tenacious surface oxide layer that inhibits or prevents satisfactory diffusion bonding because it is not absorbed at the required temperatures. This oxide layer forms quickly even at very low partial pressures of oxygen, and therefore it is extremely difficult to remove and maintain the surface totally oxide free prior to and during diffusion bonding.

For the sake of brevity, aluminium and its relevant alloys are hereinafter referred to as simply "aluminium", and any references thereto should be construed accordingly.

Several prior proposals for overcoming the problem of the oxide layer and enabling the successful diffusion bonding of aluminium have been made. For example, in our earlier European patent number EP-A-0350220, we described a method of removing the oxide layer of an aluminium component by grit blasting it and then subjecting it to a chemical treatment. Although this technique greatly reduces the problem of the oxide layer, it has been found that, despite the fact that the oxide is removed before diffusion bonding takes place, an extremely thin oxide layer is still present in the component in areas where bonding has occurred. This is thought to occur due to trace oxygen present during the bonding process, and the result is a fairly poor diffusion bond which has a low peel strength.

In another of our European patent applications, number EP-A-0398760, we describe a method of encapsulating the de-oxidised aluminium components immediately after cleaning to prevent re-oxidation. Encapsulation is facilitated by placing the aluminium components in a chamber of an electron beam welding device, evacuating the chamber and electron beam welding the edge regions of the components together. As will be appreciated, this is a costly additional step in the manufacture of components.

SUMMARY

It is an object of the embodiment of the present invention to reduce oxidation of aluminium by a method which will substantially prevent oxidation for a sufficient time period to allow diffusion bonding, and further which will allow satisfactory bonding to take place.

According to one aspect of the invention there is provided a method of reducing oxidation of a surface of aluminium or aluminium alloy including the step of causing a nitride film to form on said surface.

The nitride film may be caused to form by the steps of positioning the aluminium or aluminium alloy in a vacuum chamber, removing any oxide layer from said surface, and sputtering the surface with nitrogen ions for a predetermined time and at a predetermined energy level. This predetermined time may be substantially between five and fifteen minutes, and the predetermined energy level substantially between two and seven KeV, for example, substantially 5 KeV.

Alternatively, the nitride film may be caused to form by the steps of positioning the aluminium or aluminium alloy in a vacuum chamber, removing any oxide layer from said surface, heating the surface to a predetermined temperature, and introducing nitrogen gas to said chamber. This predetermined temperature may be substantially between 500° C. and 600° C.

Conveniently, the oxide layer is removed by removing any grease from the surface, and sputtering the surface with argon ions for a predetermined time and at a predetermined energy level. This predetermined time may be substantially between 30 and 60 minutes, for example 45 minutes. The predetermined energy level may be substantially 5 KeV.

According to another aspect of the invention there is provided a method of diffusion bonding two pieces of aluminium or aluminium alloy, wherein said two pieces have a nitride film formed thereon by a method as described above. Advantageously, a component may be formed from said two pieces of aluminium or aluminium alloy by superplastically forming them into a required shape.

According to a further aspect of the invention there is provided a component manufactured by diffusion bonding and superplastic forming as described above.

BRIEF DESCRIPTION OF THE DRAWINGS

For a better understanding of the invention, embodiments of it will now be described by way of example only, and with particular reference to the accompanying drawing, the single figure, FIG. 1, of which is a schematic diagram of the apparatus for carrying out the invention.

DETAILED DESCRIPTION OF THE DRAWINGS

The apparatus shown generally at 2 in FIG. 1 comprises a vacuum chamber 4, an ion gun 6 and a support member 8 attached to a side wall (not shown) of the vacuum chamber 4. Suitable apparatus is available from the company Vacuum Generators under the name of Escalab Mark II.

A piece of aluminium 10 to be processed is initially degreased using any suitable commonly available degreasing agent.

The piece of aluminium 10 is then positioned within the vacuum chamber 4 on support member 8. The top surface of piece 10 is then sputtered with argon ions (Ar+) injected into the chamber by the ion gun 6 for a period between 30 and 60 minutes, preferably 45 minutes. The energy of the argon ions is preferably 5 KeV. When the sputtering process is finished, the surface of the aluminium piece 10 is deoxidised.

The vacuum chamber 4 is then re-evacuated, and the surface of the aluminium piece 10 is this time sputtered with nitrogen ions ($N^+_2$) for between 5 and 15 minutes, at an energy level of between 2 and 7 KeV, preferably 5 KeV. The nitrogen ion sputtering causes an aluminium nitride ($AlN_x$) (where x is approximately 1) film to be formed on the surface of the aluminium piece 10. The surface may have a thickness ranging from 1-5 nm, depending on sputtering energy level and time.

As an alternative to nitrogen ion sputtering, after removal of oxide from the piece 10 and re-evacuation of the chamber 4 as described above, nitrogen ($N_2$) gas may be introduced into the chamber 4 while the aluminium piece 10 is heated to between 500° C. and 600° C. This heating may conveniently be imparted by heatable support member 8. Again, an aluminium nitride film is formed on the piece of aluminium 10, the thickness of which is dependent on the temperature of the piece 10, the pressure in the chamber 4, and the length of time of exposure to nitrogen gas.

The aluminium nitride film should advantageously be made just thick enough to prevent oxide forming on the surface of the aluminium.

This process has been tested on materials including aluminium alloy type 8090 and pure aluminium. Although the nitride film does itself oxidise, most of this oxidation is restricted to the surface of the nitride film.

The treated aluminium piece 10 can be removed from the vacuum chamber 4, and the surface or surfaces having a nitride film may be diffusion bonded and superplastically formed using well-known conventional techniques of heating and applying pressure, as required.

We claim:

1. A method of diffusion bonding two pieces of aluminum of aluminum alloy comprising the step of reducing oxidation of surfaces of said two pieces by forming a nitride film thereon followed by diffusion bonding said two pieces of aluminum or aluminum alloy into a component.

2. A method according to claim 1, wherein the diffusion bonding step of forming said two pieces of aluminum or aluminum alloy into a component comprises superplastically forming said pieces into a predetermined shape.

* * * * *

UNITED STATES PATENT AND TRADEMARK OFFICE
CERTIFICATE OF CORRECTION

PATENT NO.    :    5,376,187

DATED         :    DECEMBER 27, 1994

INVENTOR(S)   :    STRICKLAND et al

It is certified that error appears in the above-identified patent and that said Letters Patent is hereby corrected as shown below:

<u>ON THE TITLE PAGE:</u>

Please change:

"[22]   Filed:   April 9, 1993"

to

-- [22]   Filed:   April 12, 1993 --

Signed and Sealed this

Fifteenth Day of August, 1995

Attest:

BRUCE LEHMAN

*Attesting Officer*          *Commissioner of Patents and Trademarks*